United States Patent [19]

Cook

[11] Patent Number: 4,548,658

[45] Date of Patent: Oct. 22, 1985

[54] GROWTH OF LATTICE-GRADED EPILAYERS

[76] Inventor: Melvin S. Cook, 43 Westerly Rd., Saddle River, N.J. 07458

[21] Appl. No.: 696,438

[22] Filed: Jan. 30, 1985

[51] Int. Cl.⁴ .................... H01L 21/20; H01L 29/26
[52] U.S. Cl. .................... 148/175; 29/576 E; 29/578; 148/DIG. 67; 148/DIG. 72; 148/DIG. 97; 148/DIG. 160; 136/261; 136/262; 156/612; 357/16
[58] Field of Search ............ 148/175; 29/576 E, 578; 156/612; 136/261, 262; 357/16

[56] References Cited

U.S. PATENT DOCUMENTS

| | | | |
|---|---|---|---|
| 3,721,583 | 3/1973 | Blakeslee | 148/175 X |
| 3,963,538 | 6/1976 | Broadie et al. | 148/175 |
| 4,088,515 | 5/1978 | Blakeslee et al. | 156/612 X |
| 4,115,164 | 9/1978 | Jager et al. | 148/175 |
| 4,174,422 | 11/1979 | Matthews et al. | 156/612 X |
| 4,194,935 | 3/1980 | Dingle et al. | 148/175 |
| 4,261,771 | 4/1981 | Dingle et al. | 148/175 |
| 4,274,890 | 6/1981 | Varon | 29/576 E X |

*Primary Examiner*—William G. Saba
*Attorney, Agent, or Firm*—Gottlieb, Rackman & Reisman

[57] ABSTRACT

A method is disclosed for growing an epitaxial layer composed of semiconductor material belonging to the cubic crystal system on a substrate, where the lattice constant of the epitaxial layer is graded from an initial lattice constant adjacent to the substrate to a final lattice constant on the surface of the epitaxial layer. Growth surfaces are formed on the substrate, and the epitaxial layer is grown as its lattice constant changes from the initial lattice constant to the final lattice constant.

12 Claims, 6 Drawing Figures

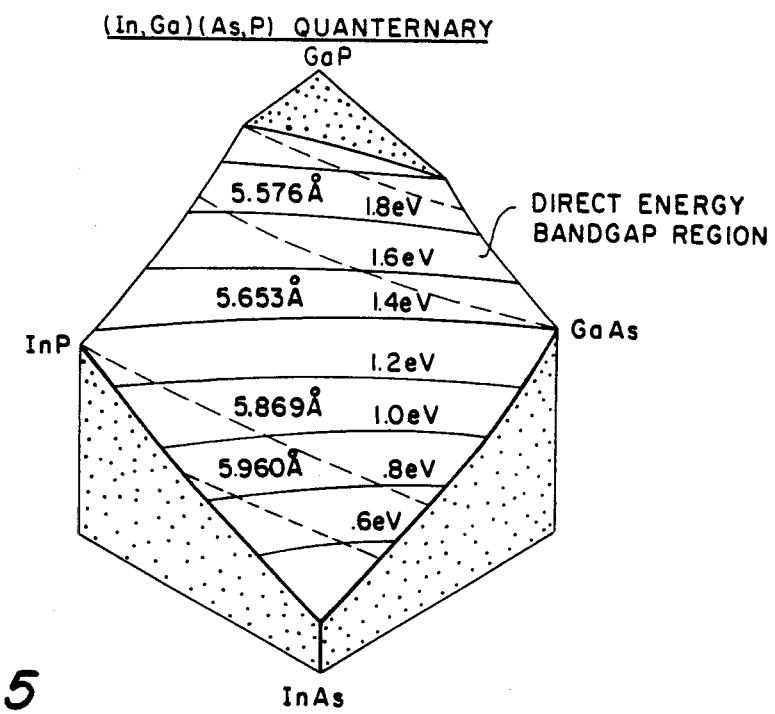
FIG.5
FIG.6
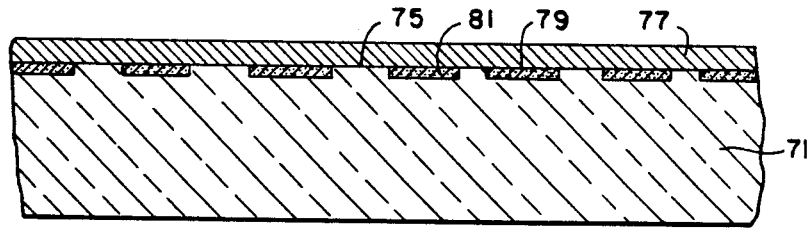

GROWTH OF LATTICE-GRADED EPILAYERS

DESCRIPTION

The present invention relates to a method of growing epitaxial layers ("epilayers") of semiconductor materials belonging to the cubic crystal system which are graded in lattice constant ("lattice-graded") from an initial value of lattice constant adjacent to the substrate on which they have been grown to a final value of lattice constant on the epilayer surface. It can be used, for example, to grow lattice-graded epilayers on crystalline substrates in the manufacture of solar cells, optical devices, and integrated circuits.

In a crystal, the atoms are arranged in a three-dimensional array known as the lattice. In the lattice, a unit cell can be specified which repeats itself in three dimensions to generate the lattice. A unit cell contains complete information regarding the arrangement of atoms in a lattice, and can be used to describe the crystal system. Crystals can be classified into seven crystal systems, one of which is the cubic crystal system.

In general, three vectors are required to specify a unit cell. In the cubic crystal system, these three vectors are mutually orthogonal and have the same magnitudes. Therefore, a unit cell in the cubic crystal system can be specified by a single scalar quantity, its lattice constant. In the cubic crystal system, the lattice constant is the length of an edge of the cube containing the unit cell.

The present invention is concerned solely with epilayers composed of semiconductor materials belonging to the cubic crystal system. Materials of such a nature include silicon, germanium, gallium arsenide, and indium phosphide, for example.

Semiconductors which incorporate expensive constituents often possess properties of interest. However, the high cost of substrates of these materials is an impediment to their use. If good quality epilayers of such materials could be grown on less expensive substrates, then the resulting structures would find applications. Available substrates of good crystalline quality which are inexpensive are often sufficiently different in lattice constant from the epilayer materials of interest that good quality epilayers cannot be grown on them. No general method is known for growing good quality epilayers on substrates which are mismatched in lattice constant ("lattice-mismatched") to the epilayers.

Solar photovoltaic cells of high efficiency for the conversion of sunlight to electricity are required for utility applications. If good quality epilayers which were graded in direct energy bandgap values over a sufficiently wide range were available, they could form part of a solar cell of sufficient efficiency for utility applications. However, if it is necessary to utilize only materials which are matched in lattice constant ("lattice-matched"), then it has not yet been possible to obtain an epilayer graded in energy bandgap values ("bandgap-graded") over a wide enough range for a solar cell of sufficient efficiency to be possible.

It is an object of the present invention to provide a method for growing lattice-graded epilayers.

It is an additional object of the present invention to provide a method for growing bandgap-graded epilayers.

It is a further object of the present invention to provide a method for growing epilayers on lattice-mismatched substrates.

Briefly, in accordance with the principles of my invention and in the preferred embodiment thereof, a lattice-graded epilayer is to be grown on a crystalline substrate. Growth surfaces are formed on the substrate. The epilayer will be grown on the growth surfaces. In the preferred embodiment, each growth surface conforms to a portion of a spherical surface of radius $R_s$. The growth surfaces are separated by a dielectric coating layer on which nucleation of the epilayer material is not a favored process. Techniques well known in the art can be used to form the growth surfaces and the coating layer. For example, photolithographic, etching, machining, casting, recrystallizing, oxidizing, or nitriding processes can be used to form the growth surfaces and the coating layer.

Convex growth surfaces are used if the lattice constant is to be increased during epilayer growth, and concave growth surfaces are used if the lattice constant is to be decreased during epilayer growth.

After the growth surfaces have been formed, an epilayer can be grown on them, starting with an initial lattice constant and ending with a final lattice constant differing from the initial lattice constant. In the preferred embodiment, this change in lattice constant results from a change in the material composition of the epilayer during its growth. Techniques for growing an epilayer while changing its material composition are well known in the art, e.g., chemical vapor deposition ("CVD") can be used, and the composition of the vapor supplying the materials for epilayer growth can be changed during the epilayer growth process.

Preferably, the crystallographic orientation of the substrate and the magnitude of $R_s$ are selected such that a relatively constant growth rate over the epilayer surface results, so that the epilayer surface during its growth continues to conform to portions of spherical surfaces having a common center with the growth surfaces of the substrate.

If the lattice constant is to be changed as epilayer growth proceeds, then the ratio of the lattice constant $\alpha_1$ of the material on the surface of the epilayer at a first point in time when this surface has a radius $R_1$ to the lattice constant $\alpha_2$ of the material on the surface of the epilayer at a later point in time when this latter surface has a radius $R_2$ should be greater than or equal to $R_1/R_2$ if $\alpha_1 < \alpha_2$, and should be less than or equal to $R_1/R_2$ if $\alpha_1 > \alpha_2$. When these relationships are obeyed, then the epilayer will be grown with minimum strain for a given $R_s$. These relationships can be used to calculate the minimum epilayer thickness required to grow the epilayer with minimum strain. This minimum epilayer thickness must be large enough so that the strains produced in the epilayer as a result of the change in lattice constant do not exceed the elastic limit, either in compressive strain or in tensile strain, of the epilayer material.

In a particular example, concave growth surfaces can be formed on the surface of a gallium antimonide substrate with an $R_s$ equal to 100 micrometers and a maximum circular diameter on the substrate of 50 micrometers. A preferred crystallographic orientation of the substrate is the (100)-orientation. A lattice-graded epilayer with a thickness of 9.65 micrometers can be grown on the substrate using compounds from the (Ga)(Sb,As,P) family of ternary compounds, starting with a lattice constant of 6.096 Angstroms and ending with a lattice constant of 5.560 Angstroms ($GaAs_{0.56}P_{0.46}$). Such an epilayer will have a direct energy bandgap graded from 0.7 eV at the substrate to 2.0 eV at its surface. If the substrate is composed of n-type material, and the epilayer is composed of p-type material, then the epilayer and the substrate could form part of a solar cell with a theoretical efficiency of 45% at one thousand suns concentration (Borrego, J. M., Ghandi, S. K., and Page, D. A., *A High Efficiency Bulk Graded Band Gap/PN Junction Solar Cell Structure At High Concentration Ratios*, 17th IEEE Photovoltaic Specialists Conference, 1984).

In a lattice-graded epilayer, the lattice constant is a function of the epilayer composition and state of strain at a point. If the strain exceeds the elastic limit, either in compressive strain or in tensile strain, defects may appear in the epilayer which are detrimental to crystal quality and which have an adverse effect in applications of the epilayer.

The present invention provides a method whereby the stresses arising due to a change in the lattice constant of the epilayer can be reduced.

If a first element of area $dA_1$ lies on the surface of the growing epilayer at a first point in time $T=T_1$, where the lattice constant of the epilayer surface enclosed by $dA_1$ is $\alpha_1$, there is a correlated second element of area $dA_2$ which lies on the surface of the epilayer at a second and later point in time $T=T_2$, where the lattice constant of the epilayer surface enclosed by $dA_2$ is $\alpha_2$. The correlation between $dA_1$ and $dA_2$ is such that as T increases from $T_1$ to $T_2$ and epilayer growth proceeds, epitaxial material will grow from $dA_1$ and the surface of this epitaxial material will coincide with $dA_2$ at $T=T_2$. In order to reduce the stresses and strains in the epilayer which result from changes in the lattice constant of the epilayer between $T=T_1$ and $T=T_2$, $dA_2$ must differ from $dA_1$. If the lattice constant is being decreased, then the ratio of $dA_1$ to $dA_2$ must be greater than unity, and if the lattice constant is being increased, the the ratio of $dA_1$ to $dA_2$ must be less than unity. That is, if $\alpha_1$ is greater than $\alpha_2$, then $dA_1/dA_2$ is greater than unity, and if $\alpha_1$ is less than $\alpha_2$, $dA_1/dA_2$ is less than unity.

For minimum stress and strain during epilayer growth, the change in the magnitude of $dA_2$ with respect to $dA_1$ must correspond to the dilation or contraction of the unit cells of the lattice of the epilayer crystal, i.e., must correspond to the decrease or the increase of the lattice constant, where the substrate growth surfaces are formed and the lattice constant is changed during epilayer growth in such a manner that strains exceeding the elastic limit, either in compressive strain or tensile strain, do not occur. Preferably, $dA_1/dA_2 \geq (\alpha_1/\alpha_2)^2$ if $\alpha_1$ exceeds $\alpha_2$, whereas $dA_1/dA_2 \leq (\alpha_1/\alpha_2)^2$ if $\alpha_1$ is less than $\alpha_2$.

In the preferred embodiment of the present invention previously discussed, the substrate growth surfaces and the surfaces of the growing epilayer conform to spherical surfaces having common centers, and $dA_2$ is the radial projection of $dA_1$ onto the surface of the epilayer at $T_2$. If $R_1$ and $R_2$ are the radii of the surfaces on which $dA_1$ and $dA_2$, respectively, lie, then $dA_1/dA_2=(R_1/R_2)^2$, and if $\alpha_1$ is larger than $\alpha_2$, then $R_1/R_2 \geq \alpha_1/\alpha_2$, whereas if $\alpha_2$ is larger than $\alpha_1$, then $R_1/R_2 \leq \alpha_1/\alpha_2$.

The above relationships describe criteria which result in epilayer growth with minimum strain in the epilayer for a given epilayer thickness. However, for the type of materials used to grow epilayers in the present invention, it is often true that materials with larger lattice constants have larger coefficients of thermal expansion. When such is the case for materials incorporated in an epilayer grown under minimum strain conditions, then strains may develop in the epilayer when it is cooled down from the elevated temperatures typically encountered during growth of the materials. If the epilayers are grown with thicknesses somewhat less than those required for minimum strain during growth, then the strains introduced into the epilayer on cooling from growth temperatures will partially or totally relieve strains introduced into the epilayer during its growth. Such a reduction in epilayer thickness must not be done in such a manner, however, that the elastic limits of the epilayer are exceeded during growth, either in compressive strain or in tensile strain. In this regard, it is generally true that materials of the type used to grow epilayers in the present invention have greater ability to withstand a strain of a given magnitude when it is a compressive rather than a tensile strain.

Further objects, features, and advantages of my invention will become apparent upon consideration of the following detailed description in conjunction with the drawing, in which:

FIG. 5 is a view in perspective of a three-dimensional surface representing the relationships between material compositions, lattice constants, and direct energy bandgap values for the (In,Ga)(As,P) family of quaternary compounds; and FIG. 6 is a cross-sectional view of a portion of a substrate on which an epilayer has been grown, where the substrate is lattice-mismatched to the epilayer.

Figure 1:
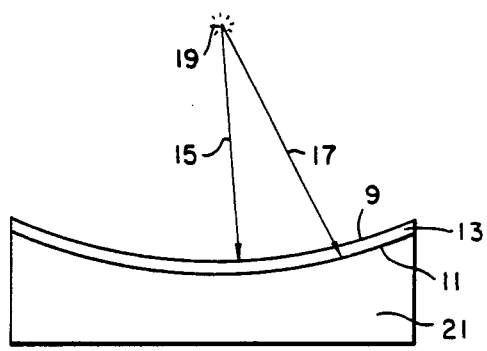
FIG. 1 is a cross-sectional view of a concave growth surface on a portion of a substrate on which a lattice-graded epilayer has been grown.

In FIG. 1, a cross-sectional view is shown of substrate 21 on which a concave growth surface 11 has been formed. The concave growth surface conforms to a portion of a spherical surface of radius 17 and center 19. A lattice-graded epilayer 13 has been grown on the concave growth surface, starting with an initial lattice constant $\alpha_1$ adjacent to the substrate, and ending with a final lattice constant $\alpha_2$, where $\alpha_1$ exceeds $\alpha_2$. The crystallographic orientation of the substrate has been selected to give a fairly constant epilayer growth rate, so that the epilayer thickness is relatively constant. As a result, surface 9 of the epilayer conforms to a portion of a spherical surface having a radius 15 and center 19. Radius 15 and radius 17 are not shown to scale in FIG. 1.

The lattice constant of the epilayer 13 has been graded in such a manner that the ratio of radius 17 to radius 15 is equal to or greater than the ratio of $\alpha_1$ to $\alpha_2$.

Figure 2:
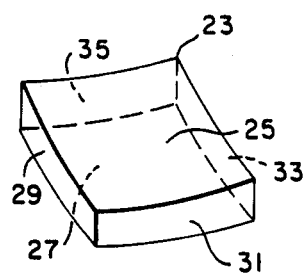
FIG. 2 is a view in perspective of an element of volume of the epilayer shown in FIG. 1.

In FIG. 2, a view in perspective is shown of an element of volume 23 of epilayer 13 (shown in FIG. 1). Element of volume 23 has a surface composed of elements of area 25, 27 29, 31, 33, and 35. Element of area 27 lies adjacent to the concave growth surface 11 (shown in FIG. 1), and element of area 25 is the radial projection of element of area 27 onto surface 9 (shown in FIG. 1). Elements of area 29, 31, 33, and 35 can be swept out by radius 17 (shown in FIG. 1) tracing the sides of elements of area 25 and 27. The ratio of the magnitude of element of area 25 to the magnitude of element of area 27 is equal to the square of the ratio of radius 15 (shown in FIG. 1) to radius 17.

Figure 3:
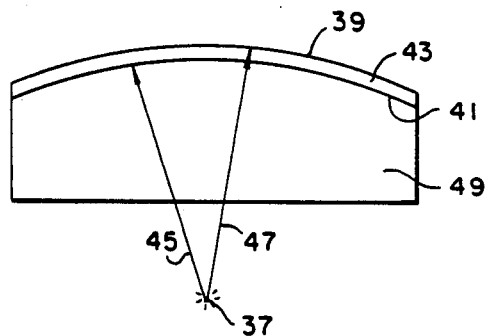
FIG. 3 is a cross-sectional view of a convex growth surface on a portion of a substrate on which a lattice-graded epilayer has been grown.

In FIG. 3, a cross-sectional view is shown of a portion of a substrate 49 on which a convex growth surface 41 has been formed. The convex growth surface conforms to a portion of a spherical surface of radius 45 and center 37. A lattice-graded epilayer 43 has been grown on the convex growth surface, starting with an initial lattice constant $a_3$ adjacent to the substrate, and ending with a final lattice constant $a_4$, where $a_4$ exceeds $a_3$. The crystallographic orientation of the substrate has been selected to give a relatively constant epilayer growth rate, so the thickness of the epilayer is relatively constant. As a result, the surface 39 of the epilayer conforms to a portion of a spherical surface of radius 47 and center 37.

The lattice constant of the epilayer 43 has been graded in such a manner that the ratio of radius 47 to radius 45 is equal to or greater than the ratio of $a_4$ to $a_3$.

Figure 4:
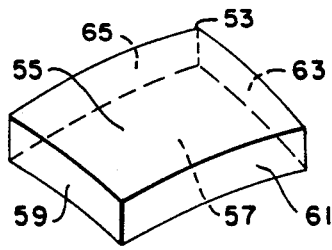
FIG. 4 is a view in perspective of an element of volume of the epilayer shown in FIG. 3.

In FIG. 4, a view in perspective is shown of element of volume 53 of epilayer 43 (shown in FIG. 3). Element of volume 53 has a surface composed of elements of area 55, 57, 59, 61, 63, and 65. Element of area 57 lies adjacent to the convex growth surface 41 (shown in FIG. 3), and element of area 55 is the radial projection of element of area 57 onto surface 39 (shown in FIG. 3). Elements of area 59, 61, 63, and 65 can be swept out by radius 47 (shown in FIG. 3) tracing the sides of elements of area 55 and 57. The ratio of the magnitude of element of area 55 to the magnitude of element of area 57 is equal to the square of the ratio of radius 47 to radius 45 (shown in FIG. 3).

In FIG. 5, a view in perspective is shown of a three-dimensional surface 69 which represents the relationships between material compositions, lattice constants, and direct energy bandgap values of the (In,Ga)(As,P) family of quaternary semiconductor compounds. Using compounds from this family, lattice constants can be graded in the range 6.058 Angstroms (InAs) to 5.560 Angstroms (GaAs$_{0.54}$P$_{0.46}$) while grading the direct energy bandgap values from 0.36 eV to 2.0 eV.

In FIG. 6, a cross-sectional view is shown of a portion of substrate 71. A coating layer 81 has been formed on the substrate except for growth surfaces 75. Each of the growth surfaces is isolated from all other of the growth surfaces. The coating layer may be formed using techniques well known in the art, e.g., photolithographic techniques and oxidizing or nitriding processes can be used for this purpose. Preferably, each of the growth surfaces has an area less than 500 square micrometers and is approximately circular in shape in order to minimize the number of defects in epilayer 77. The epilayer is initially grown over the substrate growth surfaces, and is then laterally grown over the surface 79 of the coating layer until a continuous epilayer is obtained on the substrate. Preferably, the surface of the coating layer is such that nucleation of the epilayer material on it is not a favored process. In a particular case, the substrate is a silicon substrate, and the epilayer is composed of gallium arsenide.

The strain energy at an interface between a crystalline substrate and an epilayer crystal depends on the magnitude of the mismatch in lattice constant between them. For very thin epilayers where the different in the strain-free lattice constants of the epilayer and the substrate is less than 10–15%, such strain may not give rise to defects in the epilayer. If the epilayer is not very thin or if the mismatch in lattice constants is too great, defects will appear in the epilayer. There is a critical epilayer thickness beyond which defects will appear [Jesser, W. P. and Kuhlmann-Wilsdorf, D., *Phys. Stat. Solidi,* 19, 96 (1967)].

In the embodiment of the present invention shown in FIG. 6, each of the isolated growth surfaces has a small area. As a result of the isolation and small area, the stresses arising in the epilayer initially growing over each of the growth surfaces are isolated and limited in magnitude. The strains in the epilayer during such initial growth do not lead to defects as long as the epilayer is sufficiently thin and the difference in the strain-free lattice constants of the epilayer and the substrate are not too great. As epilayer growth proceeds, the lattice constant of the epilayer can change due to the isolation of each area of initial growth. That is, each first element of area on the surface of the growing epilayer at a first point in time $T=T_1$ can be greater or lesser in magnitude than its correlated second element of area lying on the surface of the epilayer at a second point in time $T=T_2$, where $T_2$ occurs after $T_1$, depending on whether the lattice constant of the epilayer surface enclosed by $dA_1$ is greater or lesser in magnitude, respectively, than the lattice constant on the epilayer surface enclosed by $dA_2$.

In a particular case, the growth surfaces may be circular in shape and have a diameter of ten micrometers, and be formed in a pattern over the substrate surface with a center-to-center spacing of growth surfaces of fifteen micrometers.

Although the invention has been described with reference to particular embodiments, it is to be understood that these embodiments are merely illustrative of the application of the principles of my invention. Numerous modifications may be made and other arrangements may be devised without departing from the spirit and scope of the invention.

I claim:

1. A method of growing an epitaxial layer composed of semiconductor material belonging to the cubic crystal system on a substrate with the lattice constant of said epitaxial layer changing from an initial lattice constant adjacent to said substrate to a final lattice constant on the surface of said epitaxial layer when the growth is completed, comprising the steps of forming a plurality of growth surfaces on said substrate; growing an epitaxial layer on said growth surfaces and controlling the lattice constant of said epitaxial layer to change from said initial lattice constant to said final lattice constant; said growth surfaces and the controlled changes in lattice constant being such that for each first element of area on the surface of said epitaxial layer having a first lattice constant at a first point in time during growth of said epitaxial layer there is a correlated second element of area on the surface of said epitaxial layer having a second lattice constant at a second point in time during growth of said epitaxial layer, said second point in time occurring after said first point in time, with the ratio of each first element of area to its correlated second element of area being less than unity if said first lattice constant is lesser than said second lattice constant, and being greater than unity if said first lattice constant is greater than said second lattice constant; and controlling the correlation between each first element of area and its correlated second element of area such that as growth of said epitaxial layer proceeds, the portion of said epitaxial layer growing from said first element of area has a surface which coincides with said correlated second element of area at said second point in time.

2. A method of growing an epitaxial layer in accordance with claim 1 wherein a coating layer is formed on the surface of said substrate except for said plurality of growth surfaces, each of said growth surfaces having an area less than five hundred square micrometers in magnitude.

3. A method of growing an epitaxial layer in accordance with claim 1 wherein each of said plurality of growth surfaces is made to have a concave surface, and said final lattice constant is controlled to be lesser than said initial lattice constant.

4. A method of growing an epitaxial layer in accordance with claim 3 wherein said concave surface conforms to a portion of a spherical surface.

5. A method of growing an epitaxial layer in accordance with claim 1 wherein each of said plurality of growth surfaces is made to have a convex surface, and said final lattice constant is controlled to be greater than said initial lattice constant.

6. A method of growing an epitaxial layer in accordance with claim 5 wherein said convex surface conforms to a portion of a spherical surface.

7. A method of growing an epitaxial layer in accordance with claim 1 wherein said ratio of each first element of area to its correlated second element of area has a ratio magnitude, said ratio magnitude being not greater than the square of the ratio of said first lattice constant to said second lattice constant if said first lattice constant is less than said second lattice constant, and being not less than the square of the ratio of said first lattice constant to said second lattice constant if said first lattice constant is greater than said second lattice constant.

8. A method of growing an epitaxial layer in accordance with claim 7 wherein a coating layer is formed on the surface of said substrate except for said plurality of growth surfaces, each of said growth surfaces having an area less than five hundred square micrometers in magnitude.

9. A method of growing an epitaxial layer in accordance with claim 7 wherein each of said plurality of growth surfaces is made to have a concave surface, and said final lattice constant is controlled to be lesser than said initial lattice constant.

10. A method of growing an epitaxial layer in accordance with claim 9 wherein said concave surface conforms to a portion of a spherical surface.

11. A method of growing an epitaxial layer in accordance with claim 7 wherein each of said plurality of growth surfaces is made to have a convex surface, and said final lattice constant is controlled to be greater than said initial lattice constant.

12. A method of growing an epitaxial layer in accordance with claim 11 wherein said convex surface conforms to a portion of a spherical surface.

* * * * *